United States Patent [19]

Tasset

[11] Patent Number: 4,686,002

[45] Date of Patent: Aug. 11, 1987

[54] STABILIZED CHOLINE BASE SOLUTIONS

[75] Inventor: Carl J. Tasset, Springfield, Mo.

[73] Assignee: Syntex (U.S.A.) Inc., Palo Alto, Calif.

[21] Appl. No.: 887,674

[22] Filed: Jul. 18, 1986

[51] Int. Cl.$^4$ ............................ C23F 1/02; B44C 1/22; C09K 13/02; B29C 37/00

[52] U.S. Cl. ..................................... 156/659.1; 134/2; 134/34; 134/42; 156/637; 156/656; 156/655; 156/665; 156/668; 252/79.5; 252/156

[58] Field of Search ............... 252/79.5, 156; 156/637, 156/655, 656, 659.1, 664, 665, 668; 134/2, 22.13, 22.17, 29, 34, 41, 42

[56] References Cited

U.S. PATENT DOCUMENTS

| | | | |
|---|---|---|---|
| 2,823,166 | 2/1958 | Hoffman | 167/81 |
| 3,549,370 | 12/1970 | Sykes et al. | 96/55 |
| 3,897,485 | 7/1975 | Meunier | 260/501.15 |
| 3,947,491 | 3/1976 | Kelly et al. | 260/501.15 |
| 4,172,005 | 10/1979 | Muraoka et al. | 156/647 |
| 4,239,661 | 12/1980 | Muraoka et al. | 252/541 |
| 4,294,911 | 10/1981 | Guild | 430/326 |
| 4,339,340 | 7/1982 | Muraoka et al. | 252/79.5 |
| 4,425,202 | 1/1984 | Sullivan | 204/72 |
| 4,439,454 | 3/1984 | Riva | 424/329 |
| 4,464,461 | 8/1984 | Guild | 430/326 |

FOREIGN PATENT DOCUMENTS 1014688 12/1954 France .
700115 11/1953 United Kingdom .
1313923 4/1973 United Kingdom .

OTHER PUBLICATIONS

"The Merck Index", 9th ed. (1976), Merck & Co., Rahway, N.J., items 4095 and 6831.

Primary Examiner—William A. Powell
Attorney, Agent, or Firm—Derek P. Freyberg; John A. Dhuey

[57] ABSTRACT

Solutions of choline base, (2-hydroxyethyl)trimethylammonium hydroxide, in water and/or lower alkanols may be stabilized by the addition of a stabilizing concentration of formaldehyde or paraformaldehyde. The stabilized solutions may be used as cleaning solutions, etchants for semiconductors and metal layers, and developers and strippers for positive working photoresists, and for other uses where a metal ion-free base is desired.

21 Claims, No Drawings

STABILIZED CHOLINE BASE SOLUTIONS

FIELD OF THE INVENTION

This invention relates in general to choline base, (2-hydroxyethyl)trimethylammonium hydroxide, and in particular to the stabilization of solutions thereof in water and/or lower alkanols and uses for such stabilized solutions.

BACKGROUND OF THE INVENTION

Choline, also known as choline base, (2-hydroxyethyl)trimethylammonium hydroxide, is a well-known organic base suitable for a variety of uses.

For example, aqueous solutions of choline base are useful in connection with electronic applications such as positive photoresist developing agents, as anisotropic etching agents, and as washing agents for silicon wafers. U.S. Pat. No. 4,172,005 (Muraoka et al.) describes the use of an aqueous solution of trihydrocarbon-substituted (hydroxyhydrocarbon-substituted) ammonium hydroxide as an anisotropic etchant for semiconductor substrates; U.S. Pat. Nos. 4,239,661 and 4,339,340 (Muraoka et al.) describe the use of an aqueous solution of trialkyl(hydroxyalkyl) ammonium hydroxide as a cleaning agent for semiconductor wafers, as an etchant for metal layers used as wiring, and as a developer and stripper for positive working photoresist films; and U.S. Pats. Nos. 4,294,911 and 4,464,461 (Guild) describe the use of an aqueous solution of quaternary alkanol ammonium hydroxide as a developing agent for positive-working photoresists and positive-working lithographic printing plates.

Such aqueous solutions typically have choline concentrations between about 0.01% and 40% by weight choline; and are typically prepared and shipped as concentrates having a choline content of at least 10% by weight, the concentrates being diluted to concentrations typically between 1% and 5% by weight choline for use.

Solutions of choline base in lower alcohols, typically methanol, have been commercially available for many years. In concentrations as high as 50% by weight choline, they have been suggested for use as replacements for (alcoholic) solutions of common alkalies, and as catalysts, curing agents, hydrolytic agents, neutralizing agents, and solubilizing agents, and for pH control.

Use in the electronics area requires that there be no residue following the normal post bake period because even traces of impurities such as alkali metals would interfere in the operation of the electronic circuits. Accordingly, impurity specifications for choline base to be used in the electronics industry are very strict. Typically such specifications are, based upon contained choline base, less than 10,000 ppm Cl, Br, I, or carbonate and less than 15 ppm each of Li, Na, and K. It is understood, however, that it is advantageous to the electronics fabricator to employ choline base in which the above mentioned impurities approach zero.

While compositions containing a choline base developing agent are excellent developers for resists of the quinone diazide type, and have other uses as set forth above, they suffer from a serious problem in that gradual decomposition of the choline base, with consequent darkening of the composition and changes in its performance as a developer, tends to take place. A solution to this problem is provided in U.S. Pat. No. 4,294,911. The solution is the incorporation in the developing composition of the stabilizing concentration of a sulfite, for example, ammonium sulfite. Sulfites function very effectively as stabilizing agents, that is, as agents which serve to prevent or retard darkening of the composition and changes in its performance as a developer for quinone diazide compositions. As explained in U.S. Pat. No. 4,294,911, it is believed that quaternary alkanol ammonium hydroxide developing agents can decompose to form aldehydes and that the aldehydes can polymerize to form polyaldehydes, which are highly colored materials that result in a gradual darkening of the composition. Depending on the particular conditions involved, the polyaldehydes can be dimers, trimers, oligomers or low molecular weight polymers. Sulfites are believed to form adducts with the aldehydes and thereby prevent the formation of the polyaldehydes. U.S. Pat. No. 4,425,202 (Sullivan) describes the use of sulfites in the electrolytic manufacture of choline base from choline salts, where the sulfite is stated to provide color stabilization.

While the use of sulfites as stabilizing agents repesents an important advance in the art, it is subject to a serious disadvantage which has hindered the commercial utilization of developing compositions containing quaternary alkanol ammonium hydroxide developing agents. Such developing compositions are typically prepared, shipped and stored as concentrates and are diluted by the user to the proper concentration. The activity of these developing solutions is, in part, dependent on pH and the optimum pH in a given situation will depend on various factors, such as the particular ingredients in the light-sensitive composition, the particular ingredients in the developing composition, the type of equipment utilized in exposing the light-sensitive composition, the development temperature, and so forth. It has been found that if a sulfite is used as a stabilizing agent, it interferes with the titration and renders it impossible to accurately determine the total solution alkalinity by a titration process.

In U.S. Pat. No. 4,464,461, the use of a semicarbazide as a stabilizing agent is proposed for aqueous quaternary alkanol ammonium hydroxide solutions. Semicarbazides are stated to avoid the disadvantage of interference with alkalinity determination, while providing adequate stability to enable storage and shipment of concentrated solutions, and not interfering with use as a developer. Semicarbazides are, however, relatively expensive.

The disclosures of each of the documents referred to herein are incorporated herein by reference.

Methanolic choline base is generally, at the 50% by weight choline level, stabilized by the addition of ethylenediamine, typically at between 1000 and 2500 ppm of the total solution.

It would be desirable to provide a stabilized choline base solution in water and/or lower alcohols which provides the desired stability against decomposition and color formation, while still being relatively inexpensive, and not interfering with the intended use of the solution.

SUMMARY OF THE INVENTION

I have discovered that incorporation of formaldehyde or, preferably, paraformaldehyde in solutions of choline base in water and/or lower alkanols will function to stabilize the solutions. Specifically, I have found that the adverse effects resulting from the decomposition of choline base in solutions containing it can be prevented, or at least substantially reduced, by incorporating in the solution a stabilizing concentration of formaldehyde, paraformaldehyde, or a mixture thereof. Thus, solutions according to this invention, containing choline base and a stabilizing concentration of formaldehyde, paraformaldehyde, or a mixture thereof, have shelf-life characteristics substantially better than unstabilized solutions. These stabilized solutions may be used for the purposes already known to the art for unstabilized or alternatively stabilized solutions.

DETAILED DESCRIPTION OF THE INVENTION

In a first embodiment, this invention provides a stabilized choline base solution comprising choline base; a solvent selected from the group consisting of water, lower alkanols, and mixtures thereof; and a stabilizing concentration of a stabilizer selected from the group consisting of formaldehyde, paraformaldehyde, and a mixture thereof.

In a second embodiment, this invention provides methods of removing photoresist films from substrates, etching metal layers in semiconductor intermediate products, and cleaning the surface of semiconductor intermediate products, each of which methods comprises the use of a stabilized choline base solution of the first embodiment of this invention.

In this application, the following terms have the meanings set forth below:

"lower alkanol" refers to a $C_1$ to $C_3$ alkanol, i.e., methanol, ethanol, 1-propanol, and 2-propanol. A preferred lower alkanol is methanol.

"photoresist" refers to positive-working photoresists of the type known to the semiconductor, printed circuit board, and photolithographic industries. Such photoresists are exemplified by the quinone diazide/phenol-formaldehyde polymers discussed in U.S. Pat. No. 4,294,211; but other photoresists developable or strippable in alkali are also contemplated by this invention.

"removing" a photoresist film from a substrate refers to both partially and wholly removing the film, and includes the removing of exposed and/or unexposed photoresist, the operations conventionally referred to as developing and stripping of photoresist.

"substrate" refers to an intermediate product obtained in the manufacture of a semiconductor device or a printed circuit board.

"surface" refers to the surface portion of a substrate, in particular to the surface portion of an intermediate product obtained in the manufacture of a semiconductor device. Namely, "surface" includes the surface of: a wafer as sliced from an ingot, a wafer in which an impurity has been diffused, an oxide film produced on the wafer, a photoresist mounted on the surface of the wafer, and a metal layer deposited on the surface of the wafer, a printed circuit board, a metal layer on the surface of the printed circuit board, and a photoresist mounted on the surface of the printed circuit board or metal layer thereon.

"treat" or "treating" refers to the process of washing a surface, removing a photoresist selectively or wholly, and etching a metal layer.

A solution according to the present invention comprises choline base; a solvent selected from the group consisting of water, lower alkanols, and mixtures thereof; and a stabilizing concentration of a stabilizer selected from the group consisting of formaldehyde, paraformaldehyde, and a mixture thereof. Preferred solvents are water, methanol, and water/methanol mixtures.

The concentrations of choline base in the solution is typically between about 1% and 60% by weight (unless otherwise stated, "% by weight" as used herein refers to percent by weight of the total solution). For aqueous solutions, the concentration of choline base is generally less than about 40% by weight; while for solutions in lower alkanols, the concentration of choline is generally less than about 50% by weight. For solutions in water/lower alkanol solvent mixtures, the concentration of choline base is generally less than about 45% by weight, depending on the water/lower alkanol ratio. When the concentration of choline base is relatively low, for example less than about 5% to 10% by weight, the stabilization is relatively less important and the concentration of stabilizer may be lower (as discussed later) but, for convenience and economy of shipping, many of the solutions used for stripping, etching, etc. are prepared from concentrates containing more than about 10%, typically at least 15% to 20%, by weight choline base. As stated before, methanolic choline base is typically available at 50% by weight choline base. At these higher concentrations, unstabilized choline base solutions decompose, releasing trimethylamine and becoming yellow, orange, brown, and eventually black. The importance of a stabilizer is thus greater in concentrated choline base solutions, and it is particularly to these solutions containing at least 10% by weight choline base that this embodiment of the application is directed (though, of course, dilution of a stabilized choline base concentrate will result in a stabilized dilute solution).

A solution of this invention includes a stabilizing concentration of a stabilizer selected from the group consisting of formaldehyde, paraformaldehyde, and a mixture thereof. A preferred stabilizer is paraformaldehyde. While paraformaldehyde is known to hydrolyze in solution of formaldehyde, and without wishing to be bound to any theory of action of the stabilizer, it is believed that paraformaldehyde has a greater effectiveness as a stabilizer than formaldehyde because its hydrolysis is not instantaneous, and it gradually releases formaldehyde into the solution. Another advantage of paraformaldehyde is its solid form, which to some extent simplifies handling. Despite the "incompatibility" between formaldehyde and alkalies (see, e.g., "Formaldehyde Solution", item 4095 in the Merck Index, 9th ed.) and the suggestion in, e.g., U.S. Pat. No. 4,294,911 that color formation in aqueous quaternary alkanol ammonium hydroxide solutions is due to polyaldehydes, I have found that formaldehyde and, especially, paraformaldehyde are effective stabilizers for solutions of choline base.

The stabilizer can be included in the solution in any amount that is effective to stabilize it. The optimum amount will depend on several factors such as the concentration of choline base in the solution, the presence of other reagents (such as those commonly found in developing, stripping, and etching solutions, e.g. organic cosolvents, buffers, surfactants, metal ion complexing agents, etc.), the pH of the solution, etc. Typically, the stabilizer should be included in the solution in a concentration between about 0.01% and 5% by weight, preferably between about 0.1% and 1% by weight. Expressed in terms of the choline base, typically, the stabilizer should be included in the solution in a concentration between about 0.2% and 20% by weight, preferably between about 0.5% and 10% by weight, and more preferably between about 1% and 5% by weight, of the choline base present in the solution.

The stabilizer may be added to the solution by any suitable means. Formaldehyde, when used as the stabilizer, may easily be introduced by the addition of aqueous formaldehyde solution, typically the 37% aqueous solution of commerce. Paraformaldehyde may be added as the solid, or as a concentrated solution.

A solution of the present invention, when used for treating semiconductor intermediate products, is preferably substantially free of metal ions, by which is meant that the alkali metal ion concentration is preferably less than 15 ppm, and more preferably as low as 1 ppm. The halide ion concentration is preferably then lower than 10,000 ppm, and more preferably lower than 3000 ppm. For non-semiconductor uses, the concentrations of both alkali metal and halide ions may be higher, for example up to 10,000 ppm alkali metal ions, without interfering with the intended use.

In a second embodiment, this invention provides methods of removing photoresist films from substrates, etching metal layers in semiconductor intermediate products, and cleaning the surface of semiconductor intermediate products, each of which methods comprises the use of a stabilized choline base solution of the first embodiment of this invention.

Photoresists used to protect substrates in etching operations are of two main types, i.e. positive- and negative-working types. The recent tendency is to adopt the positive-working type of photoresist, because it has a good resolving power and presents a clear-cut image outline. Examples of positive-working resists include the quinone diazides.

Light-sensitive quinone diazides are well-known materials which have been extensively described in the patent literature, for example, in U.S. Pat. Nos. 2,754,209, 3,046,110, 3,046,112, 3,046,113, 3,046,116, 3,046,118, 3,046,119, 3,046,120, 3,647,443, and 3,759,711. The monomeric quinone diazide can be incorporated in an alkali-soluble resinous binder or reacted with an alkali-soluble resinous material so that it can be used satisfactorily as a resist material or can withstand the wear on printing plates.

The compositions and elements utilized in the practice of the second embodiment of this invention preferably comprise a light-sensitive polymeric compound formed from the condensation reaction of a quinone diazide, for example, 1,2-naphthoquinone-2-diazide-5-sulfonyl chloride, with a phenol-formaldehyde resin. The phenol-formaldehyde resins used in the practice of this invention, such as novolac or resole resins, are described in Chapter XV of "Synthetic Resins in Coatings," H. P. Preuss, Noyes Development Corporation (1965), Pearl River, N.Y. Novolac resins are prepared by the condensation of phenols and aldehydes under acidic conditions whereas resole resins are prepared under basic conditions. These resins are prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation.

The most suitable phenolic resins are those which are insoluble in water and trichloroethylene but readily soluble in conventional organic solvents such as methyl ethyl ketone, acetone, methanol, ethanol, etc. Phenolic resins having a particularly desirable combination of properties are those which have an average molecular weight in the range between about 350 and 40,000 and preferably in the range between about 350 and 2000, and preferred phenolic resins are cresol-formaldehyde and phenol-formaldehyde.

The light-sensitive polymeric compounds which are particularly useful in the present invention are prepared from condensation reactions of a suitble quinone diazide (e.g. one of those listed above) with a suitable phenol-formaldehyde resin.

The light-sensitive quinone diazide compositions disclosed herein can further comprise a non-light-sensitive film-forming polymer wherein the weight ratio of light-sensitive polymer to non-light-sensitive polymer is in the range of about 1:1 to about 99:1. As the amount of quinone diazide used in a photosensitive composition is increased, the described amount of non-light-sensitive polymer decreases.

The non-light-sensitive polymers are typically addition homopolymers or interpolymers formed by the addition polymerization of one or more ethylenically unsaturated compounds, generally having a molecular weight in the range of 2000–50,000. They include polymers of vinyl amines, halides, esters, and the like, styrenes, acrylates, butadiene, chloroprene, etc. Other non-light-sensitive polymers suitable for use in the present invention are film-forming condensation resins.

Photosensitive compositions can be prepared by forming a solution of the light-sensitive polymeric compound alone or mixed with a film-forming non-light-sensitive material. These compositions can then be used to form resists or lithographic plates.

The concentrations of light-sensitive polymer in the coating solutions are dependent upon the nature of the light-sensitive materials, the supports and the coating methods employed. Particularly useful coatings are obtained when the coating solutions contain from about 0.05% to about 25% by weight of light-sensitive material.

It will be recognized that additional components can be included in the coating compositions described herein. For example, dyes and/or pigments can be included to obtain colored images; and resins, stabilizers and surface active agents can be utilized to improve film formation, coating properties, adhesion of the coatings to the supports employed, mechanical strength, chemical resistance, etc.

Photosensitive elements bearing layers of the polymeric materials disclosed herein can be prepared by coating the photosensitive compositions from solvents onto supports in accordance with the usual practices. The support can also carry a filter or antihalation layer composed of a dyed polymer layer which absorbs the exposing radiation after it passes through the light-sensitive layer and eliminates unwanted reflection from the support. A yellow dye in a polymeric binder, such as one of the polymers referred to above as suitable subcoatings, is an especially effective antihalation layer when ultraviolet radiation is employed as the exposing radiation. The optimum coating thickness of a light-sensitive layer will depend upon such factors as the use to which the coating will be put, the particular light-sensitive polymer employed, and the nature of other components which may be present in the coating.

The photographic elements employed in the present embodiment can be imagewise exposed by conventional methods to a source of actinic radiation which is preferably a source which is rich in ultraviolet light. Suitable sources include carbon arc lamps, mercury vapor lamps, fluorescent lamps, tungsten filament lamps, lasers, and the like. The exposed elements can then be developed by flushing, soaking, swabbing, or otherwise treating the light-sensitive layers with the choline base solution of this invention. The exposed areas of the coating will be removed by the solution while the unexposed areas will be unaffected. The development time can vary widely depending on such factors as the strength of the solution and the particular light-sensitive composition utilized, and can range from a few seconds to several minutes, most typically from about 30 seconds to about 120 seconds.

A preferred procedure for etching comprises cleaning the substrate which is to be etched, applying the photoresist solution by a suitable technique such as spraying, dipping or whirl coating, and then drying the coating. If desired, a prebake of 10 to 30 minutes at 80°-100° C. is given to remove residual solvent. Alternatively, a preformed film of photoresist may be applied to the substrate. The coating is then exposed through a pattern to a light source. The resist coating is then placed in the developing composition to remove the exposed areas. The developing composition can also contain dyes and/or pigments and hardening agents. The developed image is rinsed with distilled water, dried and, optionally, post-baked for 15 to 30 minutes at 80°-120° C. The substrate can then be etched by an appropriate acid etching solution.

Normally, an aqueous solution containing 1% to 10% by weight, preferably 1% to 7% by weight, more preferably 2% to 5% by weight of choline base is used to remove (develop) those portions of the photoresist which are exposed to light, and an aqueous solution containing the same or, generally, higher concentrations, for example, more than 10% up to 20% by weight, is applied in etching those portions of the photoresist which are not exposed to light.

Also, an aqueous solution containing 0.01 to 20% by weight of choline base is adapted to etch a wiring metal layer, particularly an aluminum layer formed on a semiconductor wafer. Selective etching of a metal layer is generally carried out by photo-etching through the steps of vapor-depositing a metal layer on the surface of a semiconductor wafer, coating a photoresist film on said metal layer, etching or developing the photoresist film into a prescribed pattern and selectively etching the metal layer through the photoresist thus etched. The metal layer generally has a thickness of about 1 to 3 microns and is etched in two steps, initially at a relatively quick rate and later at a slow rate when the metal layer is etched to a thickness of about 1000 Angstroms in order to avoid excess etching.

When etched by the stabilized choline base solution of the invention, a metal layer is preferably immersed several minutes in an aqueous solution containing 5% to 10% by weight of choline base at 60°-70° C., and then the aqueous solution is cooled to room temperature to perform the latter step of etching. An aqueous solution contining 0.01% to 5% by weight of choline base has a relatively slow etching rate and should advisably be used in the latter step of etching.

Where the surface portion of a substrate, e.g., an intermediate product obtained in manufacturing a semiconductor device, is washed by the stabilized choline base solution of the invention, the product has only to be immersed 5 to 20 minutes in the solution kept at 70°-90° C. and, more preferably, subjected to ultrasonic cleaning. The solution used in this case contains 0.01% to 20% by weight, more preferably 0.1% to 5% by weight, especially 1% to 3% by weight of choline base.

According to this invention, substrates can be satisfactorily treated, as described above, with a stabilized solution of choline base. Namely, cleaning of organic and inorganic contaminants and selective etching of a metal layer can be effected by an aqueous solution containing 0.01 to 20% by weight of choline base; selective etching or development of those portions of a positive-working photoresist which are exposed to a light can be carried out by an aqueous solution containing 1 to 10% by weight of choline base; and removal of those portions of the positive-working photoresist which are not exposed to a light is attained by an aqueous solution containing up to 20% by weight of choline base.

Such methods of use have been extensively described in the patent and other literature for unstabilized and alternatively stabilized solutions of choline base, for example, as in those patents discussed in the "BACKGROUND TO THE INVENTION" section of this application, and incorporated herein by reference. These set forth compositions (including the concentration of choline base, the solvents, surfactants, metal ion complexing agents, etc.), times and temperatures of use, substrates, etc., such that a person of ordinary skill in the art is enabled to use these prior art solutions. The use aspects of this invention will thus not be discussed further except to state that the stabilized choline base solutions of this invention will function and may be used in a similar manner.

EXAMPLES

The invention is further illustrated, without limitation, by the following examples. In the first three examples, the stability of the choline base solution was determined by measuring the concentration of trimethylamine in the solution.

EXAMPLE 1

Methanol Solvent

45% by weight choline base in methanol was prepared by the reaction of ethylene oxide with a methanolic solution of 1:1 trimethylamine/water. The trimethylamine content of the stock solution as prepared was 19 ppm. Sufficient paraformaldehyde to give solutions containing 0.05%, 0.1%, 0.5%, and 1% by weight of paraformaldehyde, and sufficient ethylenediamine to give a reference solution containing 0.15% by weight ethylenediamine (the usual stabilizer for methanolic choline base), when mixed with 15 g of solution, were weighed into 20 ml screw-cap sample vials (one vial for each stabilizer concentration and analysis period), and 15 g of the stock solution added to each vial. The samples were mixed by agitation of the vials, and stored in the dark at ambient temperature (approximately 25° C.) until analysis. Vials were opened, and samples analyzed at two-week intervals for trimethylamine content, and the color noted (each vial was analyzed only once, and the sample discarded after opening, to avoid repeated exposure to air of the longer-term samples). The trimethylamine content was determined by extraction of a 10 mL sample into chloroform, development of the color by reaction with picric acid solution, and spectrophotometric comparison with standard solutions of trimethylamine treated identically. Table 1 shows the trimethylamine (TMA) content versus time for the samples over a period of eight weeks.

TABLE 1

TMA Content of 45% Methanolic Choline Base

| Stabilizer | Start | 2 weeks | 4 weeks | 6 weeks | 8 weeks |
|---|---|---|---|---|---|
| 0.05% PF* | 19 clr# | 349 yellow | 528 orange | 513 " | 844 lt. brown |
| 0.1% PF | 19 clr | 229 lt. ylw | 384 " | 423 " | 572 yellow |
| 0.5% PF | 19 clr | 99 " | 226 " | 248 " | 313 vl. ylw |
| 1.0% PF | 19 clr | 91 " | 171 " | 212 yellow | 343 " |
| 0.15% EDA* | 19 clr | 477 lt. ylw | 670 " | 630 " | 978 yellow |

*PF = paraformaldehyde, EDA = ethylenediamine.
Colors: ditto means same as on left; clr = colorless, ylw = yellow, lt. = light, vl. = very light.

As can be seen from Table 1, paraformaldehyde, even in lower concentrations than ethylenediamine, is a better stabilizer for choline base.

EXAMPLE 2

Methanol/Water Solvent

46% by weight choline base in methanol, prepared as above, was diluted to a choline base concentration of 25% by weight with distilled water (resulting in a stock solution containing approximately 29% methanol and 46% water). Solutions containing 0.05% and 0.1% by weight of paraformaldehyde, 0.05% and 0.1% by weight of formaldehyde, and a reference solution containing 0.14% by weight ethylenediamine were prepared from the stock solution by the method of Example 1. Samples were analyzed at two-week intervals for trimethylamine content, also by the method of Example 1. Table 2 shows the trimethylamine (TMA) content versus time for the samples over a period of eight weeks.

TABLE 2

TMA Content of 25% MeOH/Water Choline Base

| Stabilizer | 2 weeks | 4 weeks | 6 weeks | 8 weeks |
|---|---|---|---|---|
| 0.05% PF* | 126 | 189 | 293 | ** |
| 0.1% PF | 119 | 147 | 206 | 254 |
| 0.05% F* | 116 | 188 | 273 | ** |
| 0.1% F | 101 | 163 | 239 | 350 |
| 0.14% EDA* | 124 | 263 | 402 | ** |

*PF = paraformaldehyde, F = formaldehyde, EDA = ethylenediamine.
**These samples were not analyzed because they had already become dark brown.

As can be seen from Table 2, both paraformaldehyde and formaldehyde, even in lower concentrations than ethylenediamine, are better stabilizers for choline base, and result in significantly less colored solutions.

EXAMPLE 3

Water Solvent

A stock solution of 20% by weight choline base in water was prepared from aqueous solutions of trimethylamine and ethylene oxide. Solutions containing 0.1%, 0.5%, and 1.0% by weight of paraformaldehyde; 0.1%, 0.5%, and 1.0% by weight of formaldehyde; and reference solutions containing 0.1%, 0.5%, and 1.0% by weight ammonium sulfite (cf. U.S. Pat. No. 4,294,911) were prepared from the stock solution by the method of Example 1, together with two unstabilized samples. Samples were analyzed at two-week intervals for trimethylamine content, also by the method of Example 1, and examined for color. Table 3 shows the trimethylamine (TMA) content and color versus time for the samples over a period of eight weeks.

TABLE 3

TMA Content of 20% Aqueous Choline Base

| Stabilizer | Start | 2 weeks | 4 weeks | 6 weeks | 8 weeks |
|---|---|---|---|---|---|
| 0.1% PF* | 68 clr | 559 " | 729 orange | 957 lt. brn | 1006 brown |
| 0.5% PF | 68 clr | 99 " | 131 " | 212 " | 458 yellow |
| 1.0% PF | 68 clr | 72 " | 95 " | 116 " | 141 " |
| 0.1% F* | 68 clr | 574 " | 746 yellow | 1093 lt. brn | 1329 " |
| 0.5% F | 68 clr | 186 " | 391 " | 780 yellow | 893 lt. orange |
| 1.0% F | 68 clr | 162 " | 196 " | 439 vl. ylw | 696 yellow |
| 0.1% AS* | 68 clr | 668 lt. org | 825 orange | 1132 lt. brn | 1108 " |
| 0.5% AS | 68 clr | 906 yellow | 923 " | 989 lt. org | 1225 " |
| 1.0% AS | 68 clr | 949 lt. ylw | 1164 yellow | 1139 " | 1183 " |
| None | 68 clr | 786 orange | 819 " | 844 brown | 940 " |
| None | 68 clr | 767 orange | 738 " | 949 brown | 929 " |

*PF = paraformaldehyde, F = formaldehyde, AS = ammonium sulfite.
Colors: ditto means same as on left; clr = colorless, ylw = yellow, org = orange, brn = brown, lt. = light, vl. = very light.

As can be seen from Table 3, both paraformaldehyde and formaldehyde, even in lower concentrations than ammonium sulfite, are better stabilizers for choline base, and the stabilized solutions have both lower TMA content and better color than unstabilized solutions.

EXAMPLE 4

Use of Stabilized Choline Base

Samples of 48.8% by weight stabilized (0.1% by weight paraformaldehyde) and commercial "48%" methanolic choline base were compared as stripping agents for photoresist films on printed circuit boards. Various baths typical of those used to strip dry film photoresists were prepared as blanks containing no base, and the stabilized and commercial choline base added to these blanks to prepare the stripping solutions. Baths of the stripping solutions were maintained at 47°-53° C., and small test panels of printed circuit board coated with various resists were immersed in each solution and agitated periodically to keep fresh stripping solution in contact with the resist and flush away loosened particles of resist. The time at which the resist started to visibly degrade, the time at which all of the resist was removed from the surface of the test panel, and the size of the particles into which the resist broke were recorded. Table 4 shows the times (minutes:seconds) and particle sizes (range in mm) for three resists.

TABLE 4

Stripping Properties of Stabilized Choline Base

| | Time/Particle size | | |
|---|---|---|---|
| Stripper | Dynachem Laminar TA | du Pont Riston 3615 | du Pont Riston 218 |
| A* + 3 mL M* | :52-1:21 1.5-3 mm | :43-1:04 3 mm | 1:17-1:59 3-6 mm |
| A + 3 mL S* | :38-1:11 0.3 mm | :43-1:06 3 mm | 1:17-2:04 3-6 mm |
| B* + 4 mL M | :28-1:12 1.5 mm | :56-1:08 3 mm | 1:43-2:16 Sheeted |

TABLE 4-continued

Stripping Properties of Stabilized Choline Base

| Stripper | Time/Particle size | | |
|---|---|---|---|
| | Dynachem Laminar TA | du Pont Riston 3615 | du Pont Riston 218 |
| B + 4 mL S | :23–1:24 0.3 mm | :58–1:08 1.5 mm | 1:43–2:16 Sheeted |
| C* + 3 mL M | 1:23–1:53 3 mm | 1:12–1:21 3 mm | 3:23–4:56 3 mm |
| C + 3 mL S | 1:23–1:35 1.5 mm | 1:06–1:21 1.5–3 mm | 2:35–5:00 1.5 mm–3 mm |
| D* + 3 mL M | 1:28–2:39 3 mm | 1:03–2:01 3 mm | 5:40–8:43 Sheeted |
| D + 3 mL S | 4:34–6:02 1.5 mm | 1:58–3:27 0.3–3 mm | 6:00–7:20 Sheeted |
| E* + 5 mL M | 1:42–4:14 0.3–1.5 mm | 1:58–5:07 3 mm | 6:09–10:00+ |
| E + 5 mL S | 2:30–4:58 0.7 mm | 1:09–3:54 1.5 mm | 4:20–6:09 Sheeted |

*Blanks:
A = 8 mL 2-aminoethanol, 10 mL 2-butoxyethanol, 100 mL water;
B = 4 mL 2-aminoethanol, 2 mL 2-butoxyethanol, 100 mL water;
C = 10 mL 2-butoxyethanol, 100 mL water;
D = 2 mL 2-butoxyethanol, 100 mL water;
E = 100 mL water.
Bases:
M = methanolic choline base;
S = stabilized 48.8% methanolic choline base.

As can be seen from Table 4, the commercial choline base and the stabilized choline base of this invention performed in the same manner.

While this invention has been described above with respect to certain preferred embodiments and examples, these preferred embodiments and examples are for the purpose of illustration and completeness of disclosure, and should not be construed as limiting.

I claim:

1. A stabilized choline base solution comprising choline base; a solvent selected from the group consisting of water, lower alkanols, and mixtures thereof; and a stabilizing concentration of a stabilizer selected from the group consisting of formaldehyde, paraformaldehyde, and a mixture thereof.

2. The solution of claim 1 wherein the concentration of choline base is between about 1% and 60% by weight of the solution.

3. The solution of claim 2 wherein the concentration of choline base is at least about 10% by weight of the solution.

4. The solution of claim 1 wherein the solvent is water.

5. The solution of claim 4 wherein the concentration of choline base is between about 10% and 40% by weight.

6. The solution of claim 3 wherein the solvent is a lower alkanol.

7. The solution of claim 6 wherein the solvent is methanol.

8. The solution of claim 7 wherein the concentration of choline base is between about 10% and 50% by weight.

9. The solution of claim 1 wherein the solvent is a mixture of water and a lower alkanol.

10. The solution of claim 9 wherein the solvent is a mixture of water and methanol.

11. The solution of claim 10 wherein the concentration of choline base is between about 10% and 50% by weight.

12. The solution of claim 1 wherein the stabilizer consists essentially of formaldehyde.

13. The solution of claim 12 wherein the concentration of stabilizer is between about 0.2% and 20% by weight of the choline base.

14. The solution of claim 13 wherein the concentration of stabilizer is between about 0.5% and 10% by weight of the choline base.

15. The solution of claim 1 wherein the stabilizer consists essentially of paraformaldehyde.

16. The solution of claim 15 wherein the concentration of stabilizer is between about 0.2% and 20% by weight of the choline base.

17. The solution of claim 16 wherein the concentration of stabilizer is between about 0.5% and 10% by weight of the choline base.

18. The solution of claim 1 which is substantially free of metal ions.

19. A method of removing a photoresist film from a substrate which comprises contacting a substrate having a positive-working photoresist film thereon with a solution at a temperature and for a time sufficient to remove at least a portion of the photoresist film from the substrate, the solution comprising an effective amount of choline base; a solvent selected from the group consisting of water, lower alkanols, and mixtures thereof; and a stabilizing concentration of a stabilizer selected from the group consisting of formaldehyde, paraformaldehyde, and a mixture thereof.

20. A method of etching a metal layer in the surface of an intermediate product obtained in the manufacture of a semiconductor device which comprises contacting the surface of an intermediate product obtained in the manufacture of a semiconductor device having a metal layer thereon with a solution at a temperature and for a time sufficient to etch at least a portion of the metal layer, the solution comprising an effective amount of choline base; a solvent selected from the group consisting of water, lower alkanols, and mixtures thereof; and a stabilizing concentration of a stabilizer selected from the group consisting of formaldehyde, paraformaldehyde, and a mixture thereof.

21. A method of cleaning the surface of an substrate which comprises contacting the surface of the substrate with a solution at a temperature and for a time sufficient to clean the surface of the substrate, the solution comprising an effective amount of choline base; a solvent selected from the group consisting of water, lower alkanols, and mixtures thereof; and a stabilizing concentration of a stabilizer selected from the group consisting of formaldehyde, paraformaldehyde, and a mixture thereof.

* * * * *